(12) United States Patent
Mogaveera

(10) Patent No.: US 11,894,175 B2
(45) Date of Patent: Feb. 6, 2024

(54) SYSTEM TO OPTIMIZE VOLTAGE DISTRIBUTION ALONG HIGH VOLTAGE DOUBLER STRING

(71) Applicant: Applied Materials, Inc., Santa Clara, CA (US)

(72) Inventor: Vasu Mogaveera, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 558 days.

(21) Appl. No.: 17/159,658

(22) Filed: Jan. 27, 2021

(65) Prior Publication Data
US 2022/0238269 A1  Jul. 28, 2022

(51) Int. Cl.
*H01F 27/28* (2006.01)
*H01F 27/26* (2006.01)
(Continued)

(52) U.S. Cl.
CPC ......... *H01F 27/26* (2013.01); *H01F 27/2804* (2013.01); *H01F 27/40* (2013.01);
(Continued)

(58) Field of Classification Search
CPC ......... H01F 27/2804; H01F 2027/2809; H01F 17/0013; H01F 17/0006; H01F 5/003; H01F 27/26; H01F 27/40; H01F 2027/408; H01F 27/288; H01F 27/2885; H01F 27/36; H01F 2017/008; H05K 1/0254; H05K 2201/0707
(Continued)

(56) References Cited

U.S. PATENT DOCUMENTS

| 3,123,760 A | 3/1964 | Wouk et al. |
| 3,239,751 A | 3/1966 | Sibary |

(Continued)

FOREIGN PATENT DOCUMENTS

| CN | 214674929 U | * 11/2021 |
| TW | 201112594 A | * 4/2011 |

(Continued)

OTHER PUBLICATIONS

International Search Report and Written Opinion dated Apr. 11, 2022 in corresponding PCT application No. PCT/US2021/063809.

*Primary Examiner* — Tszfung J Chan
(74) *Attorney, Agent, or Firm* — NIELDS, LEMACK & FRAME, LLC.

(57) ABSTRACT

A high voltage power supply is disclosed. The high voltage power supply comprises a primary winding and one or more secondary windings. In one embodiment, a single secondary winding is used and the high voltage doubler circuit comprises a capacitor string and a diode string. In another embodiment, a plurality of secondary windings are used and the high voltage doubler circuit comprises a plurality of low voltage doubler circuits arranged in series. To create a more uniform distribution of voltage across the capacitors in the high voltage doubler circuit, one or more shields are disposed on the printed circuit board. In certain embodiments, a high voltage shield is disposed at the high voltage output and a low voltage shield is disposed at the low voltage end of the high voltage doubler circuit. One or more intermediate shields may be disposed in the high voltage doubler circuit.

9 Claims, 6 Drawing Sheets

(51) Int. Cl.
  *H01F 27/40*  (2006.01)
  *H05K 1/02*  (2006.01)
(52) U.S. Cl.
  CPC ..... *H05K 1/0254* (2013.01); *H01F 2027/408* (2013.01); *H05K 2201/0707* (2013.01)
(58) Field of Classification Search
  USPC .................. 336/84 R, 84 C, 84 M, 200, 232
  See application file for complete search history.

(56) References Cited

U.S. PATENT DOCUMENTS

| | | | |
|---|---|---|---|
| 3,317,659 | A | 5/1967 | Frey |
| 4,034,283 | A | 7/1977 | Pellegrino |
| 5,008,913 | A | 4/1991 | Negle |
| 5,631,815 | A | 5/1997 | Cross |
| 6,026,004 | A | 2/2000 | Cross |
| 6,449,178 | B1 * | 9/2002 | Sakai ...................... H01F 29/14 363/131 |
| 7,177,164 | B1 * | 2/2007 | Bearden .............. H02M 3/3376 363/25 |
| 2006/0109033 | A1 | 5/2006 | Sundaram |
| 2009/0041192 | A1 | 2/2009 | Sundaram et al. |
| 2013/0021827 | A1 | 1/2013 | Ye |
| 2013/0070493 | A1 | 3/2013 | Luerkens et al. |
| 2018/0153500 | A1 * | 6/2018 | Ishiyama ................ A61B 6/032 |
| 2018/0205315 | A1 | 7/2018 | Guiliano et al. |

FOREIGN PATENT DOCUMENTS

| | | | |
|---|---|---|---|
| TW | 201711360 | A | 3/2017 |
| WO | 92/19085 | A1 | 10/1992 |

* cited by examiner

SYSTEM TO OPTIMIZE VOLTAGE DISTRIBUTION ALONG HIGH VOLTAGE DOUBLER STRING

FIELD

Embodiments of this disclosure are directed to systems for uniformly distributing voltage along a high voltage doubler string in the secondary windings of a printed circuit board.

BACKGROUND

Insulated Core Transformer (ICT) high voltage power supplies are a common method of generating a high voltage DC output from an AC voltage. The input AC voltage is in communication with a primary winding.

In certain embodiments, there is a single secondary winding that multiplies the input voltage by a factor equal to the ratio of the number of turns in the secondary winding to the number of turns in the primary winding. Rectification and doubling of the voltage is provided using a voltage doubler circuit, which comprises diodes and capacitors. Typically, the voltage doubler comprises two capacitors to store voltage and two diodes, each of which allows current flow in only one direction. The capacitors are arranged in series, resulting in a doubling of the voltage. Because of cost and high voltage ratings, rather than using two diodes and two capacitors, a larger number of low voltage rated diodes and capacitors may be arranged in series. For example, 20 capacitors, each rated for 100V, may be arranged in series rather than using two capacitors, each rated for 1000V. Diodes may be similarly configured.

In other embodiments, there are a plurality of secondary windings, each with a dedicated voltage doubler circuit. The voltage doubler circuits are arranged in series to generate the desired higher DC voltage.

In each embodiment, ideally, the same voltage would be stored by each capacitor in the system. In other words, if the desired output voltage was 2000V, and there were 20 capacitors, ideally, there would be a 100V potential across each of these capacitors. However, in reality, stray capacitance affects each capacitor, such that some store less than the ideal voltage, while other capacitors are forced to store more than the ideal voltage. Similarly, the voltage across some diodes may be greater than the voltage across other diodes.

This non-uniform distribution of voltage across the capacitors and diodes may lead to voltage stress on these components, which may result in premature component failure.

Therefore, it would be advantageous if there were a system and method to improve the voltage uniformity across these components. Further, it would be beneficial if this approach was low cost and easy to implement.

SUMMARY

A high voltage power supply is disclosed. The high voltage power supply comprises a primary winding and one or more secondary windings. In one embodiment, a single secondary winding is used and the high voltage doubler circuit comprises a capacitor string and a diode string. In another embodiment, a plurality of secondary windings are used and the high voltage doubler circuit comprises a plurality of low voltage doubler circuits arranged in series. To create a more uniform distribution of voltage across the capacitors in the high voltage doubler circuit, one or more shields are disposed on the printed circuit board. In certain embodiments, a high voltage shield is disposed at the high voltage output and a low voltage shield is disposed at the lower voltage end of the high voltage doubler circuit. One or more intermediate shields may be disposed in the high voltage doubler circuit.

According to one embodiment, a high voltage power supply is disclosed. The high voltage power supply comprises a primary winding; a secondary winding, having a first end and a second end; and a printed circuit board comprising: a capacitor string, comprising a plurality of capacitors arranged in series, wherein a negative end of a first capacitor in the capacitor string is at a lower voltage and a positive end of a last capacitor in the capacitor string is at a high voltage output; a diode string, comprising a plurality of diode arranged in series, wherein an anode of a first diode in the diode string is connected to the lower voltage and a cathode of a last diode in the diode string is connected to the high voltage output; wherein the first end is electrically connected to a midpoint of the capacitor string and the second end is electrically connected to a midpoint of the diode string; and a high voltage shield disposed at the positive end of the last capacitor and electrically connected to the high voltage output, wherein a shield comprises a wide trace disposed on one or more layers of the printed circuit board. In certain embodiments, the high voltage power supply comprises a low voltage shield disposed at the negative end of the first capacitor and electrically connected to the lower voltage. In certain embodiments, the high voltage shield and the low voltage shield each comprises a signal trace having a length of between 40 mm and 100 mm and a width of between 3 mm and 10 mm. In some embodiments, the high voltage shield and the low voltage shield are disposed on a same side of the printed circuit board as the capacitor string. In some embodiments, the high voltage shield and the low voltage shield are disposed on an opposite side of the printed circuit board as the capacitor string. In certain embodiments, the high voltage power supply comprises an intermediate shield disposed between two adjacent capacitors in the capacitor string and electrically connected to a trace connecting the two adjacent capacitors. In certain embodiments, the intermediate shield is disposed at the midpoint of the capacitor string. In certain embodiments, the high voltage power supply comprises a second intermediate shield disposed between a different two adjacent capacitors in the capacitor string. In some embodiments, a voltage across the first capacitor is within 10% of a voltage across the last capacitor.

According to another embodiment, a high voltage power supply is disclosed. The high voltage power supply comprises: a primary winding; a plurality of secondary windings, each having a first end and a second end; and a printed circuit board comprising: a plurality of low voltage doubler circuits, arranged in series, to form a high voltage doubler circuit having a lower voltage at a first end and a high voltage output at a second end, wherein each low voltage doubler circuit comprises a positive end and a negative end and comprises a first capacitor and a second capacitor arranged in series and a first diode and a second diode arranged in series, wherein a positive end of the first capacitor is electrically connected a cathode of the first diode and comprises the positive end of the low voltage doubler circuit, and a negative end of a second capacitor is electrically connected to an anode of the second diode and comprises the negative end of the low voltage doubler circuit, wherein a first end of a respective secondary winding is electrically connected to a trace connecting the first capacitor and the second capacitor, and the second end of the secondary winding is electrically connected to a trace connecting the first diode and the second diode; and a high voltage shield disposed at the second end of the high voltage doubler circuit and electrically connected to the high voltage output, wherein a shield comprises a wide trace disposed on one or more layers of the printed circuit board. In certain embodiments, the high voltage power supply comprises a low voltage shield disposed at the first end of the high voltage doubler circuit and electrically connected to the lower voltage. In some embodiments, the high voltage shield and the low voltage shield each comprises a signal trace having a length of between 40 mm and 100 mm and a width of between 3 mm and 10 mm. In some embodiments, the high voltage shield and the low voltage shield are disposed on a same side of the printed circuit board as the high voltage doubler circuit. In some embodiments, the high voltage shield and the low voltage shield are disposed on an opposite side of the printed circuit board as the high voltage doubler circuit. In certain embodiments, the high voltage power supply comprises an intermediate shield disposed between two adjacent low voltage doubler circuits. In some embodiments, the intermediate shield is disposed at a midpoint of the high voltage doubler circuit. In certain embodiments, the high voltage power supply comprises a second intermediate shield disposed between a different two adjacent low voltage doubler circuits. In some embodiments, a voltage across a first low voltage doubler circuit disposed closest to the first end is within 10% of a voltage across a last low voltage doubler circuit disposed closest to the second end.

BRIEF DESCRIPTION OF THE FIGURES

For a better understanding of the present disclosure, reference is made to the accompanying drawings, which are incorporated herein by reference and in which.

DETAILED DESCRIPTION

The present disclosure describes a system and method for creating a more uniform voltage distribution across a plurality of capacitors and diodes in an ICT high voltage DC power supply.

Figure 1:
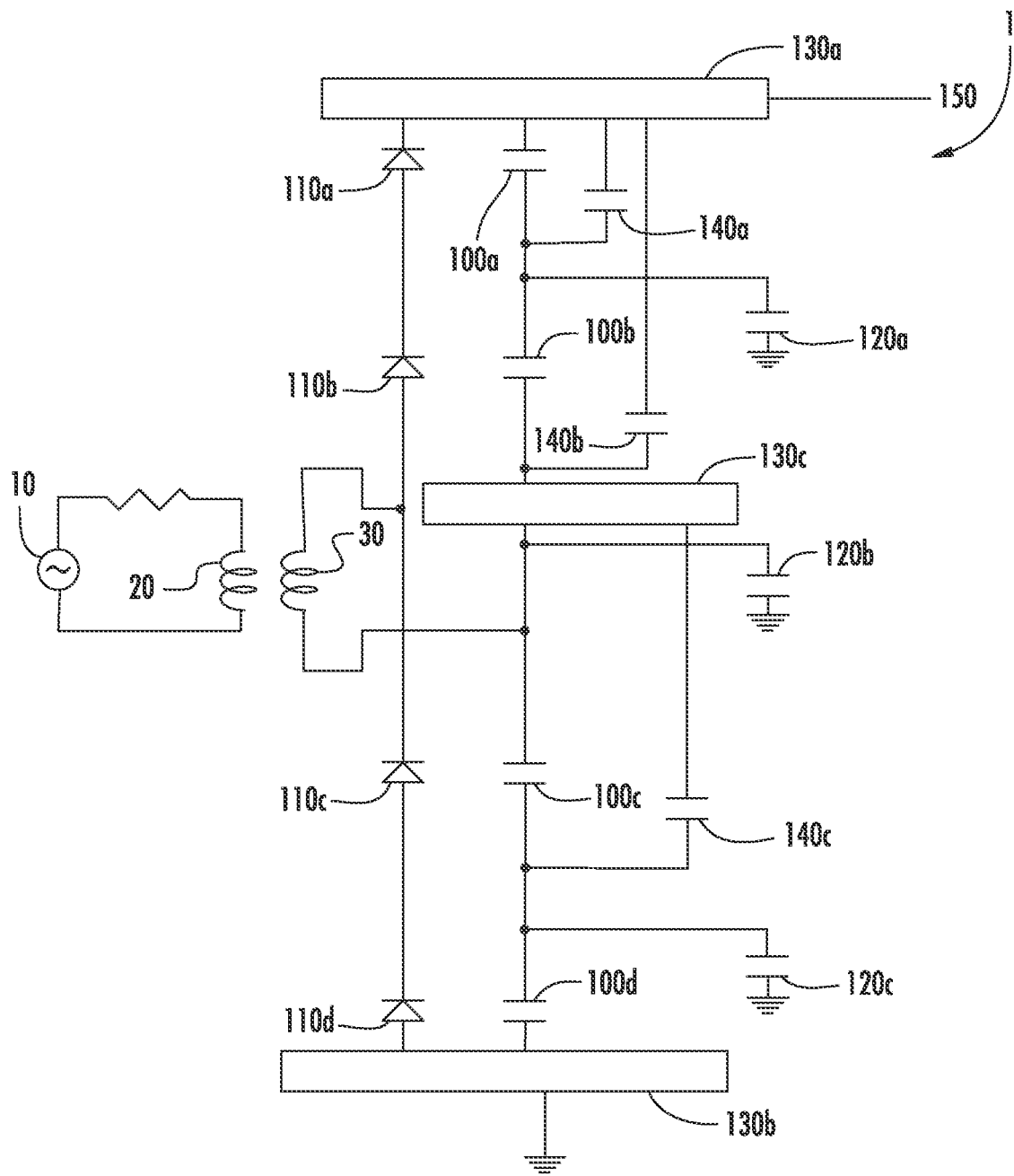
FIG. 1 shows a representative schematic showing a high voltage power supply in which voltage non-uniformity has been compensated according to one embodiment.

FIG. 1 shows a first embodiment of a voltage doubler circuit 1, wherein there is an external power supply 10, a primary winding 20 and a single secondary winding 30. The components of the voltage doubler circuit 1 are disposed on a printed circuit board. The printed circuit board may be a traditional printed circuit board having a plurality of layers, wherein conductive layers are separated from one another by an insulating material, such as FR4. In certain embodiments, the printed circuit board may comprise two conductive layers; the top surface and the bottom surface. Electrical traces may be disposed on these layers of the printed circuit board. Via may be used to connect traces on the top surface to traces on the bottom surface. These electrical traces are used to electrically connect various components disposed on the printed circuit board. In other embodiments, there may be more than two conductive layers.

The voltage doubler circuit 1 also comprises a capacitor string. The string comprises a plurality of capacitors 100, such as capacitors 100*a*, 100*b*, 100*c*, 100*d* arranged in series. The capacitor may each have the same capacitance and voltage rating. A first end of the capacitor string is connected to the lower voltage, which may be ground, and the second end of the capacitor string is the high voltage output 150. The voltage doubler circuit 1 also comprises a string of diodes. The diode string comprises plurality of diodes 110, such as diodes 110*a*, 110*b*, 110*c*, 110*d*, also arranged in series. A first end of the diode string is connected to the lower voltage, and the second end of the diode string is the high voltage output 150. The cathode of one diode is connected to an anode of an adjacent diode in the diode string. Thus, the anode of the first diode is connected to the lower voltage and the cathode of the last diode in the diode string is connected to the high voltage output 150. During the positive portion of the AC cycle, diodes 110*a*, 110*b* conduct and charge the capacitors 100*a*, 100*b* disposed between the midpoint and the high voltage output 150. During the negative portion of the AC cycle, diodes 110*c*, 110*d* conduct and charge the capacitors 100*c*, 100*d* disposed between the midpoint and the lower voltage. Thus, the cathode of each diode is at a higher voltage than the anode of that diode. Further, diode 110*a* is at a higher voltage than diode 110*b*. Similarly, diode 110*c* is at a higher voltage than diode 110*d*.

In certain embodiments, the number of diodes 110 and capacitors 100 is equal. In other embodiments, the number of diodes 110 and capacitors 100 may be different. The number of capacitors 100 and diodes 110 may be an even number such that there is an equal number of diodes and capacitors on each side of the midpoint. The first end of the secondary winding 30 is electrically connected to the midpoint of the capacitor string. The second end of the secondary winding 30 is electrically connected to the midpoint of the diode string. The midpoint denotes that the same number of capacitors 100 (and diodes 110) are disposed between the first end and the midpoint as are disposed between the midpoint and the second end.

While FIG. 1 shows four capacitors 100*a*, 100*b*, 100*c*, 100*d* and four diodes 110*a*, 110*b*, 110*c*, 110*d*, the disclosure is not limited to this embodiment. Rather, the number of capacitors 100 and diodes 110 is not limited by this disclosure. Further, the number of capacitors 100 and diodes 110 do not need to be the same.

Because the voltage doubler circuit 1 is disposed on a printed circuit board, there may an inherent capacitance between each trace in the voltage doubler circuit 1 and other traces that are at a different voltage. These stray capacitances are illustrated in FIG. 1 as stray capacitor 120*a*, 120*b*, 120*c*. Note that these stray capacitors 120*a*, 120*b*, 120*c* are not physical components. Rather, FIG. 1 represents the stray capacitance as actual components to better illustrate the subject matter. Although not shown, there is stray capacitance associated with each diode 110.

In reality, the stray capacitors 120*a*, 120*b*, 120*c* affect the voltage that is stored in each capacitor 100*a*, 100*b*, 100*c*, 100*d*. In practice, as current flows down the capacitor string, a small amount of current is diverted from each trace and passes through the corresponding stray capacitor. Therefore, slightly more current may flow through capacitor 100a than flows through capacitor 100b. This may cause more voltage to be stored by capacitor 100a than by capacitor 100b. Similarly, more current may flow through capacitor 100b than flows through capacitor 100c.

To compensate for this stray capacitance, the present system utilizes one or more shields 130. A shield 130 is a wide trace disposed on one or more layers of the printed circuit board. A shield may have a width and/or length that is larger than a typical trace. For example, a shield may be a rectangular trace that is connected to a voltage. For example, in certain embodiments, the shield 130 may be disposed on the top surface or the bottom surface of the printed circuit board. In certain embodiments, the shield 130 may be disposed on both the top surface and the bottom surface. The shield 130 is electrically connected to a voltage. For example, in FIG. 1, there are three shields 130. The high voltage shield 130a is disposed at the top of the capacitor string and electrically connected to the high voltage output 150.

Due to the size of the high voltage shield 130a, it creates capacitive coupling with other traces in the voltage doubler circuit 1. For example, there is a capacitive coupling between the high voltage shield 130a and the lower voltage end of capacitor 100a. This capacitance is represented as shield capacitor 140a. Similar capacitive coupling exists between the high voltage shield 130a and some of the other traces in the capacitor string. One such coupling is represented as shield capacitor 140b. Note that these shield capacitors 140a, 140b, 140c are not physical components. Rather, FIG. 1 represents the shield capacitance as actual components to better illustrate the subject matter.

The shield capacitors serve to supply current to traces that are at a lower potential than the voltage of that shield. In this way, while the stray capacitors tend to divert current away from the capacitor string, shield capacitors tend to inject current into the capacitor string.

FIG. 1 shows a high voltage shield 130a located at the high voltage output 150. However, other shields may also be present. For example, in this figure, a low voltage shield 130b is disposed at the lower voltage, which may be ground. In other embodiments, a plurality of printed circuit boards may be connected in series, and the lower voltage may be the output of the previous printed circuit board in the series and is therefore the next stage input voltage. In both cases, the low voltage shield 130b serves to reduce the effect of stray capacitance. An intermediate shield 130c is disposed at the midpoint of the capacitor string. Capacitive coupling may exist between the intermediate shield 130c and some of the other traces in the voltage doubler circuit 1. For example, one such capacitive coupling is represented as shield capacitor 140c.

For example, assume the capacitor string comprises 20 capacitors, where the capacitors are numbered sequentially from the lower voltage to the high voltage output. In one embodiment, an intermediate shields 130c may be disposed at the positive end of the $10^{th}$ capacitor (i.e. the midpoint).

Of course, other embodiments are also possible. For example, intermediate shields 130c may be disposed at closer intervals, if desired. Intermediate shields 130c may be disposed at the positive end of the $5^{th}$, $10^{th}$, and $15^{th}$ capacitor Alternatively, the intermediate shields 130c may be disposed at the positive end of the $4^{th}$, $8^{th}$, $12^{th}$, and $16^{th}$ capacitor. In certain embodiments, the intermediate shields 130c are equally spaced, however, in other embodiments, the intermediate shields 130c may not be equally spaced.

Thus, the intermediate shields 130c may be disposed between any two adjacent capacitors in the capacitor string. In other embodiments, the intermediate shields 130c may be omitted.

The choice of the number of shields 130 and their locations may be based on a number of factors. The size of the shields 130 may be based on the amount of voltage compensation that is desired. Additionally, the amount of stray capacitance may also be a function of the geometry and material properties of the printed circuit board and the placement of the signal traces on the printed circuit board. Thus, the size and number of shields 130 may be based on the geometry and material properties of the printed circuit board and the desired voltage uniformity along the capacitor string.

Figure 2:
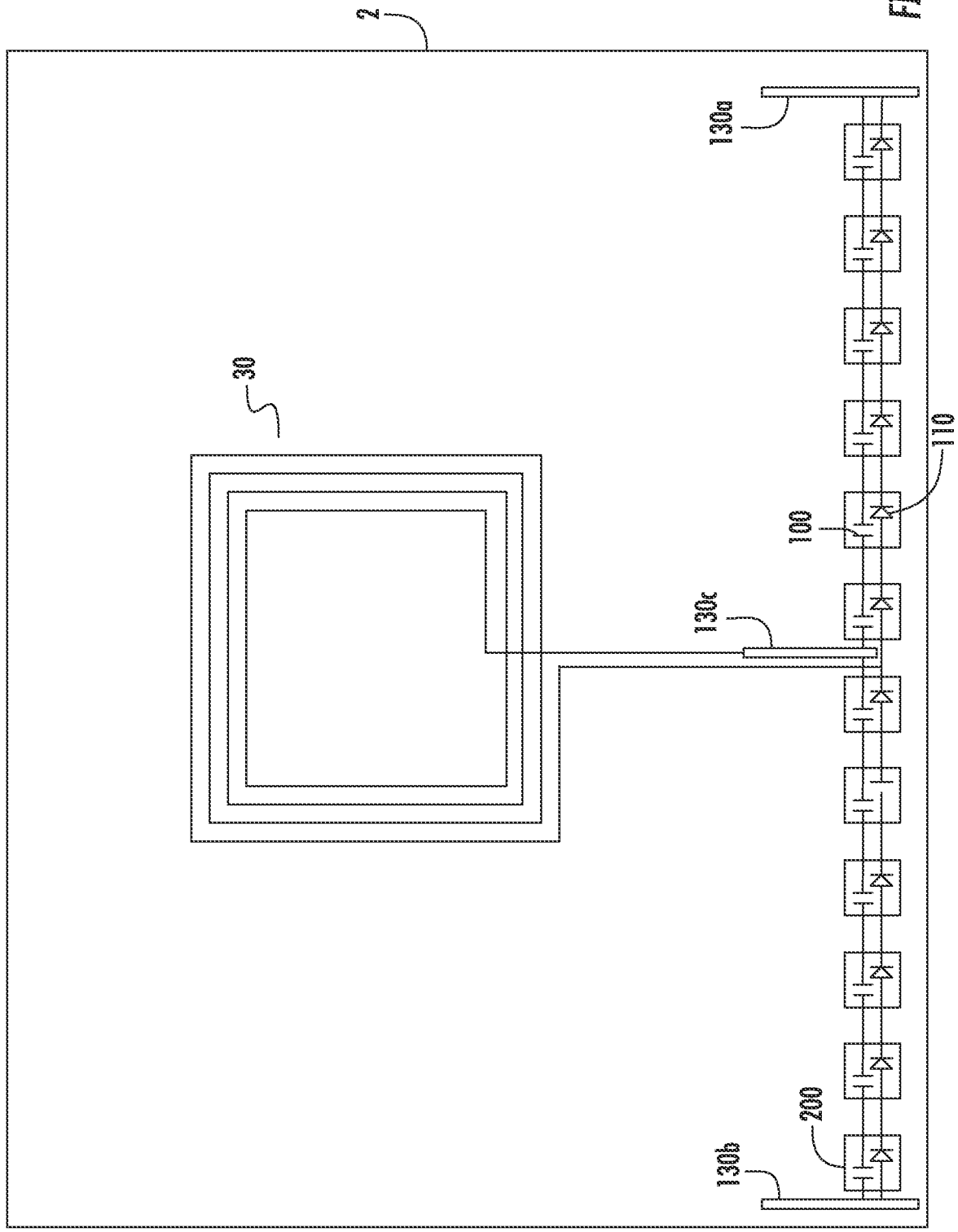
FIG. 2 shows the layout of the high voltage power supply of FIG. 1 according to one embodiment.

FIG. 2 shows a representative layout of the voltage doubler circuit 1 disposed on a printed circuit board 2. In this embodiment, there are twelve stages 200 in the capacitor string and the diode string. Each stage 200 comprises a diode 110 and a capacitor 100. Shields 130a, 130b, 130c are disposed along the capacitor string. A high voltage shield 130a may be disposed at the positive end of the twelfth capacitor, which is electrically connected to the high voltage output. The low voltage shield 130b may be disposed at the negative side of the first capacitor, which is the lower voltage and may be grounded. Further, the low voltage shield 130b is electrically connected to the negative side of the first capacitor. An intermediate shield 130c may be disposed at the midpoint of the capacitor string and electrically connected to the first end of the secondary winding 30. Thus, the voltage of the intermediate shield 130c may be the average of the lower voltage and the high voltage output.

In this embodiment, the shields 130 are shown as thick traces having a width and a length. The length of the shield may be greater than the space occupied by a stage 200. For example, in one embodiment, the shields 130 may have a length between 40 mm and 100 mm, a width of between 3 mm and 10 mm and a thickness between 75 µm and 150 µm. In one particular embodiment, the shields 130 may have a length of 60 mm, a width of 5 mm and a thickness of 110 µm. In this way, the intermediate shield 130c effectively isolates the two stages 200 on opposite sides of intermediate shield 130c. The width of high voltage shield 130a, the low voltage shield 130b, and the intermediate shield 130c may vary. In addition, there may be spacing guidelines based on the voltages of each trace which limit the width of the shields. Further, as noted above, the shield dimensions may depend on the desired voltage compensation and the geometry and material properties of the printed circuit board.

Thus, in this embodiment, the high voltage power supply comprises a single secondary winding 30 with two ends in communication with the voltage doubler circuit 1. The voltage doubler circuit 1 is disposed on a printed circuit board 2. The voltage doubler circuit 1 comprises a capacitor string, which comprises a plurality of capacitors arranged in series. The first end of the capacitor string is connected to a lower voltage, which may be ground, while the second end of the capacitor string is connected to the high voltage output. The voltage doubler circuit 1 also comprises a diode string, which comprises a plurality of diode arranged in series. The first end of the diode string is connected to the lower voltage, which may be ground, while the second end of the diode string is connected to the high voltage output. The first end of the secondary winding 30 is connected to the midpoint of the capacitor string, while the second end of the secondary winding is connected to the midpoint of the diode string. One or more shields 130 are disposed along the capacitor string. In certain embodiments, there is a high voltage shield 130a connected to the positive end of the last capacitor in the capacitor string connected to the high voltage output, and a low voltage shield 130b connected to the negative end of the first capacitor in the capacitor string connected to the lower voltage, which may be ground. One or more additional intermediate shields 130c may be disposed along the capacitor string between the high voltage shield 130a and the low voltage shield 130b. These additional intermediate shields 130c are connected to a trace connecting the positive end of one capacitor and the negative end of an adjacent capacitor along the capacitor string and are biased at voltage between ground and the high voltage output. Thus, the intermediate shield 130c is disposed along the capacitor string, disposed between two adjacent capacitors and electrically connected to the trace connecting the two adjacent capacitors.

In certain embodiments, the additional intermediate shields 130c are equally spaced apart such that the voltage between adjacent intermediate shields is equal or nearly equal. Stated differently, there may be a constant number of capacitors disposed between any two adjacent shields.

The shields may be disposed on the same side of the printed circuit board as the traces and components. In other embodiments, the shields may be disposed on both sides of the printed circuit board, or on the opposite side of the printed circuit board as the traces and components. The placement of the shields 130 is selected so as to compensate for stray capacitance and allow connection to the desired voltages.

Figure 3:
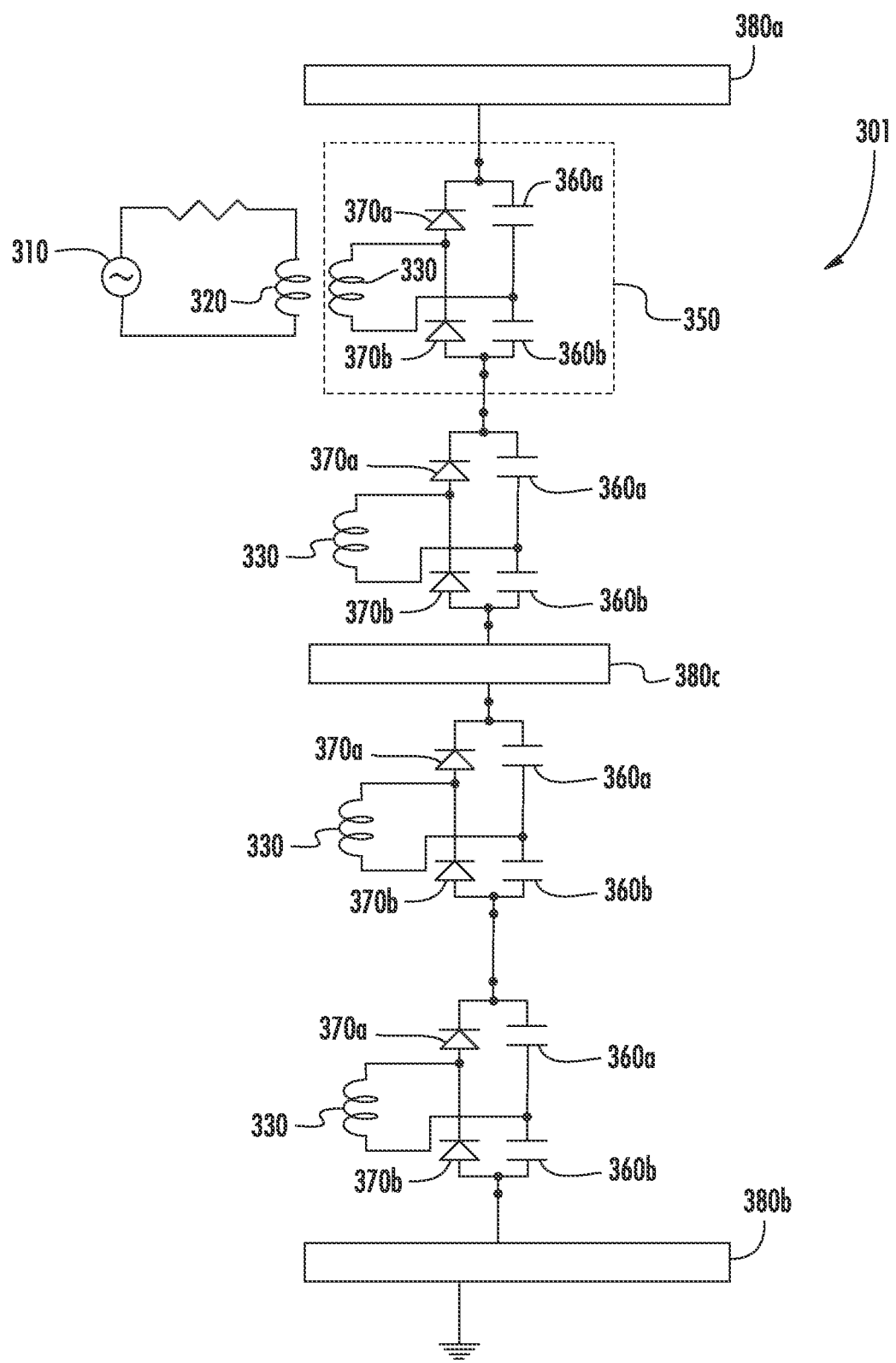
FIG. 3 shows a representative schematic showing a high voltage power supply in which voltage non-uniformity has been compensated according to one embodiment.

FIG. 3 shows a second embodiment. In this embodiment, there is an external power supply 310, a primary winding 320 and a plurality of secondary windings 330. Each secondary winding 330 is in communication with an associated low voltage doubler circuit 350. Each low voltage doubler circuit 350 comprises two capacitors 360a, 360b arranged in series, and two diodes 370a, 370b arranged in series. The first end of the secondary winding 330 is in electrical contact with the trace that connects the two capacitors 360a, 360b. The second end of the secondary winding 330 is in electrical contact with the trace that connects the anode of diode 370a to the cathode of diode 370b. The positive end of capacitor 360a is electrically connected to the cathode of diode 370a. The negative end of capacitor 360b is electrical connected to the anode of diode 370b.

The low voltage doubler circuits 350 are connected in series to create the high voltage doubler circuit 301. In other words, the cathode of diode 370a in one low voltage doubler circuit 350 is in electrical contact with the anode of diode 370b in the adjacent low voltage doubler circuit 350.

Although not shown in FIG. 3, there is stray capacitance in high voltage doubler circuit 301. As described with respect to FIG. 1, there is capacitive coupling between a trace and a second trace or component that is at a lower voltage. This stray capacitance tends to divert current away from the capacitors 360a, 360b in each low voltage doubler circuit 350.

Therefore, as was shown in the embodiment of FIG. 1, shields 380 are added. In FIG. 3, there are a plurality of shields 380. The high voltage shield 380a is electrically connected to the positive end of the most positive low voltage doubler circuit 350. This high voltage shield 380a may be biased at the high voltage output. The low voltage shield 380b is electrically connected to the negative end of the least positive low voltage doubler circuit 350. This low voltage shield 380b may be biased at a lower voltage, such as ground. There may also be additional intermediate shields 380c disposed between the high voltage shield 380a and the low voltage shield 380b. For example, in FIG. 3, there is an even number of low voltage doubler circuits 350. In this embodiment, an intermediate shield 380c is disposed such that there are an equal number of low voltage doubler circuits 350 between the intermediate shield 380c and the high voltage shield 380a and between the intermediate shield 380c and the low voltage shield 380b. Thus, if there were 20 low voltage doubler circuits 350, the intermediate shield 380c may be disposed at and connected to the trace that connects positive end of the tenth low voltage doubler circuit 350 to the negative end of the eleventh low voltage doubler circuit 350.

However, the disclosure is not limited to this embodiment. There may be additional intermediate shields 380c. For example, assuming that there are twenty low voltage doubler circuits 350, additional intermediate shields 380c may be disposed at and connected to the positive ends of the $5^{th}$, $10^{th}$ and $15^{th}$ low voltage doubler circuits 350. Alternatively, additional intermediate shields 380c may be disposed at and connected at the positive ends of the $4^{th}$, $8^{th}$ $12^{th}$, and $16^{th}$ low voltage doubler circuits 350.

In certain embodiments, the additional intermediate shields 380c are disposed at equal intervals.

Figure 4:
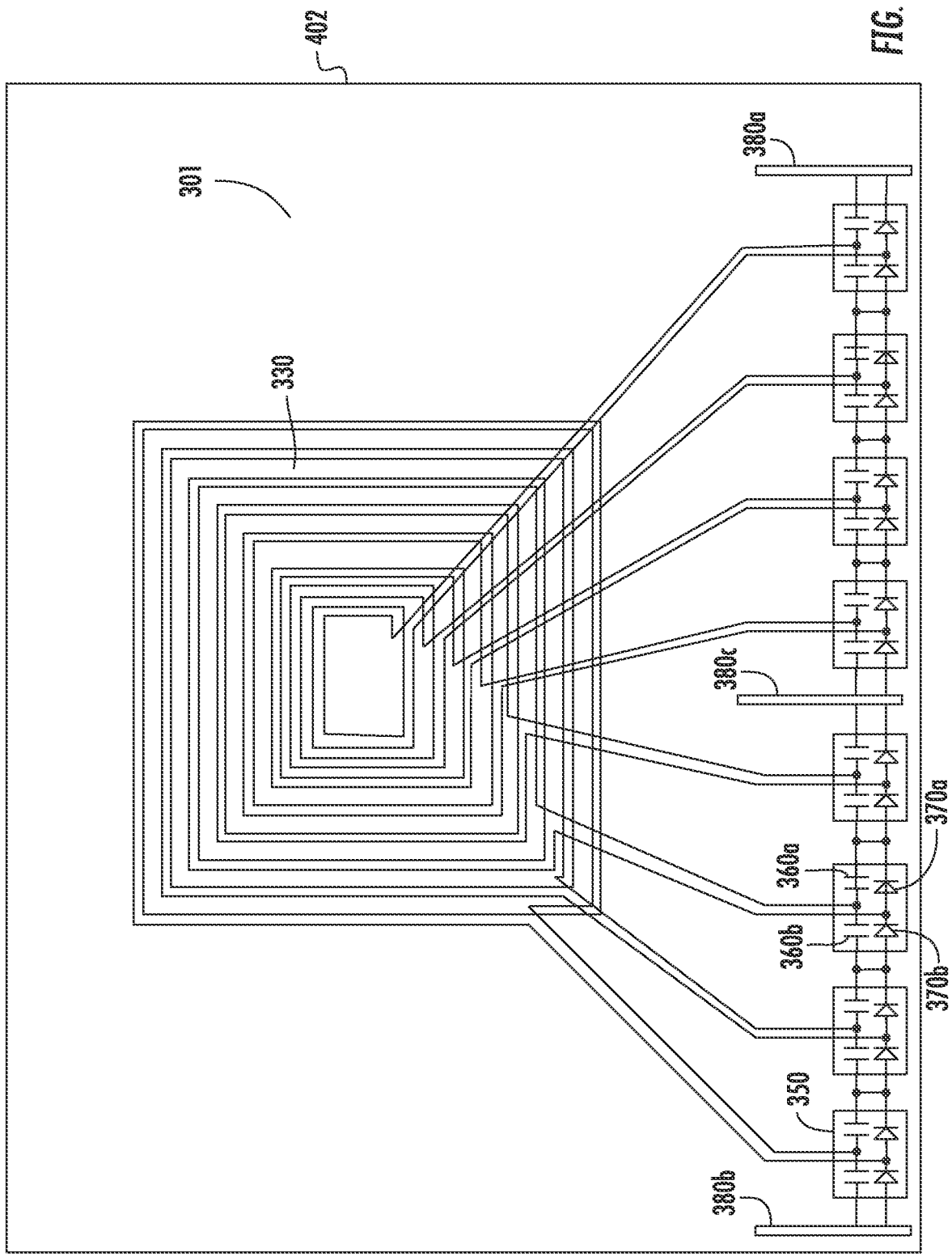
FIG. 4 shows the layout of the high voltage power supply of FIG. 3 according to one embodiment.

FIG. 4 shows a printed circuit board 402 on which the high voltage power supply is disposed. The high voltage power supply comprises a plurality of secondary windings 330, and a corresponding number of low voltage doubler circuits 350. As described above, each low voltage doubler circuit 350 comprises two capacitors 360a, 360b and two diodes 370a, 370b. Each low voltage doubler circuit 350 is electrically connected in series to at least one other low voltage doubler circuit 350 to form the high voltage doubler circuit 301. High voltage shield 380a and low voltage shield 380b may be disposed at the ends of the high voltage doubler circuit 301. Additional intermediate shields 380c may be disposed between adjacent low voltage doubler circuits 350, such as at the midpoint.

In this embodiment, the shields 380 are shown as thick traces having a width and a length. The length of the shield may be greater than the space occupied by a low voltage doubler circuit 350. For example, in one embodiment, the shields 130 may have a length between 40 mm and 100 mm, a width of between 3 mm and 10 mm and a thickness between 75 μm and 150 μm. In one particular embodiment, the shields 130 may have a length of 60 mm, a width of 5 mm and a thickness of 110 μm. In this way, the intermediate shield 380c effectively isolates the two low voltage doubler circuits 350 on opposite sides of intermediate shield 380c. The width of high voltage shield 380a, the low voltage shield 380b, and the intermediate shield 380c may be based on the available space available on the printed circuit board. In addition, there may be spacing guidelines based on the voltages of each trace which limit the width of the shields. Further, as noted above, the shield dimensions may depend on the desired voltage compensation and the geometry and material properties of the printed circuit board.

Thus, like the embodiment of FIGS. 1-2, this embodiment may comprise one or more intermediate shields disposed between elements that combine to form the high voltage doubler circuit 301. In FIGS. 1-2, these elements are capacitors, while in the embodiment of FIGS. 3-4, these elements are low voltage doubler circuits. Further, a high voltage shield may be disposed at the high voltage end of the voltage doubler circuit and a low voltage shield may be disposed at the lower voltage end of the doubler circuit.

Figure 5:
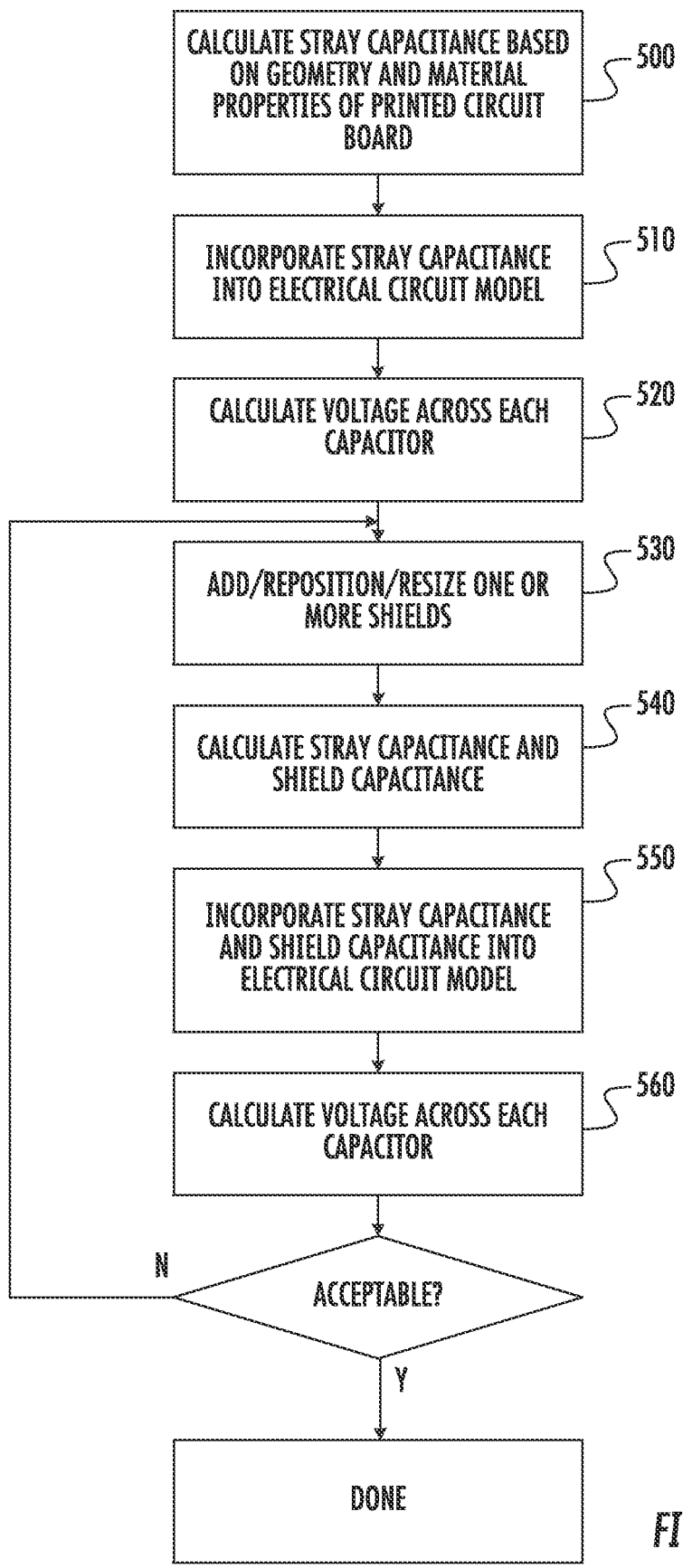
FIG. 5 shows a process to determine the placement, dimensions and number of shields according to one embodiment.

FIG. 5 shows one method that may be used to determine the placement, dimensions and number of shields that are to be included in the high voltage power supply. As shown in Box 500, first, the stray capacitance is calculated based on the geometry and material properties of the printed circuit board design. This may be done theoretically or using an electrostatic simulation tool. As shown in Box 510, the calculated stray capacitance is then incorporated into the electrical circuit design. Then, as shown in Box 520, the voltage across each capacitor in the capacitor string (see FIG. 1-2) or the high voltage doubler circuit (see FIG. 3-4) can be calculated using electrical circuit theory, or a simulation tool, such as PSPICE. Based on this result, one or more shields may be incorporated into the design, as shown in Box 530. The stray capacitance and the shield capacitance can then be calculated theoretically or using an electrostatic simulation tool, as shown in Box 540. As shown in Box 550, the calculated stray capacitance and shield capacitance is then added to the electrical circuit design. Then, as shown in Box 560, the voltage across each capacitor in the capacitor string (see FIG. 1-2) or the high voltage doubler circuit (see FIG. 3-4) can be calculated using electrical circuit theory, or a simulation tool, such as PSPICE. If the resulting voltage distribution is acceptable, the process is complete. If the voltage distribution is not acceptable, the placement, number or dimension of the shields is modified by repeating Boxes 530-560 until the distribution is acceptable.

Figure 6:
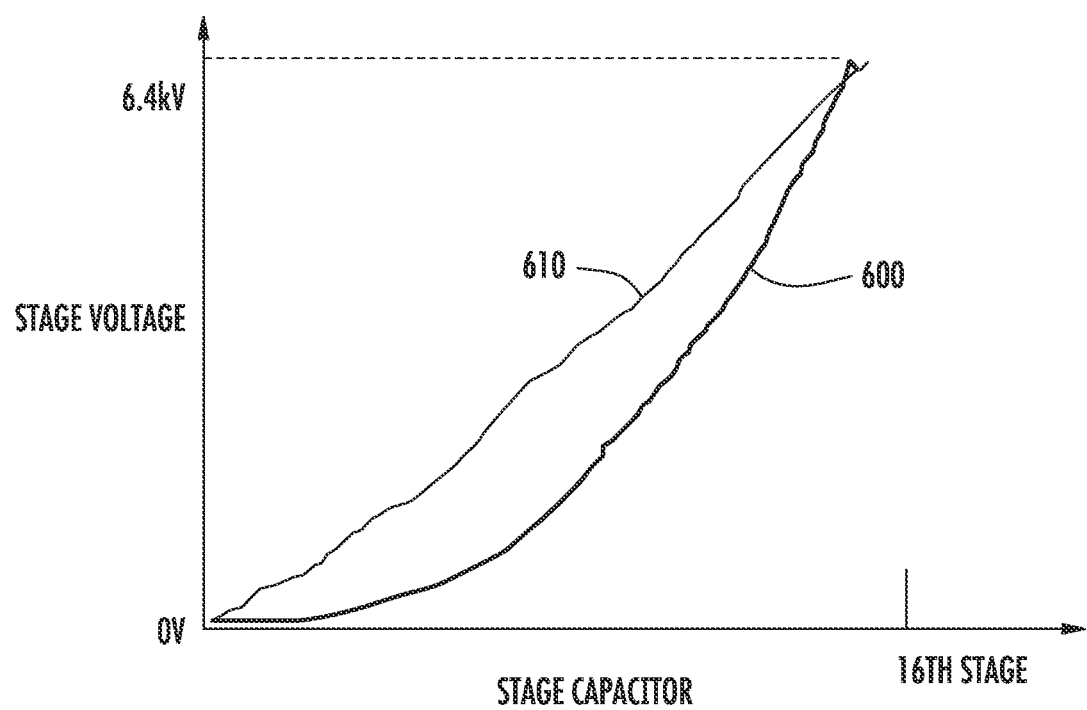
FIG. 6 shows the voltage distribution of elements in a high voltage power supply as compared to the prior art.

The system described herein has many advantages. Simulations were performed for a high voltage power supply having an output of 6.4 kV using 16 elements. These elements may be capacitors, such as shown in FIG. 1 or low voltage doubler circuits, as shown in FIG. 3. Thus, ideally, the voltage across each element may be 400V. As shown in line 600 of FIG. 6, in the prior art, the distribution of voltage across the elements of the high voltage doubler circuit is not linear. Rather, the elements that are closer to the high voltage output store more voltage than those that are closer to the lower voltage. In fact, in this simulation, the voltage of the element closest to the high voltage output was calculated to be 564.8V, while the voltage of the element closest to the lower voltage was calculated to be only 237.2V. If the capacitors are rated for 400V, the voltage stress of the capacitor closest to the high voltage output is 1.412. This may result in increased stress on the elements that are disposed near the high voltage output. This may increase the component stress and lead to premature failure. In contrast, line 610 shows the distribution of voltage across the elements of the high voltage power supply comprising a high voltage shield, a low voltage shield and an intermediate shield disposed at 3.2 kV. In other words, the shields are disposed at the minimum voltage, the maximum voltage and the midpoint. Note that the amount of voltage stored by each element in the high voltage doubler circuit is nearly identical, resulting in a graph that is nearly linear. In this simulation, the voltage of capacitor closest to the high voltage output was calculated to be 424.4V, while the voltage of the capacitor closest to the lower voltage was calculated to be 384.8V. In other words, the difference between the highest capacitor voltage and the lowest capacitor voltage is less than 10%. Furthermore, if the capacitors are rated for 400V, the voltage stress of the capacitor closest to the high voltage output is reduced to 1.061, a reduction of nearly 25%. This configuration reduces stress on the components near the high voltage output and may increase the life of the high voltage power supply.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A high voltage power supply comprising:
a primary winding;
a plurality of secondary windings, each having a first end and a second end; and
a printed circuit board comprising:
a plurality of low voltage doubler circuits, arranged in series, to form a high voltage doubler circuit having a lower voltage at a first end and a high voltage output at a second end, wherein each low voltage doubler circuit comprises a positive end and a negative end and comprises a first capacitor and a second capacitor arranged in series and a first diode and a second diode arranged in series, wherein a positive end of the first capacitor is electrically connected a cathode of the first diode and comprises the positive end of the low voltage doubler circuit, and a negative end of the second capacitor is electrically connected to an anode of the second diode and comprises the negative end of the low voltage doubler circuit, wherein the first end of a respective secondary winding of the plurality of secondary windings is electrically connected to a trace connecting the first capacitor and the second capacitor, and the second end of the respective secondary winding of the plurality of secondary windings is electrically connected to a trace connecting the first diode and the second diode; and
a high voltage shield disposed at the second end of the high voltage doubler circuit and electrically connected to the high voltage output, wherein a shield comprises a wide trace disposed on one or more layers of the printed circuit board.

2. The high voltage power supply of claim 1, further comprising a low voltage shield disposed at the first end of the high voltage doubler circuit and electrically connected to the lower voltage.

3. The high voltage power supply of claim 2, wherein the high voltage shield and the low voltage shield each comprises a signal trace having a length of between 40 mm and 100 mm and a width of between 3 mm and 10 mm.

4. The high voltage power supply of claim 2, wherein the high voltage shield and the low voltage shield are disposed on a same side of the printed circuit board as the high voltage doubler circuit.

5. The high voltage power supply of claim 2, wherein the high voltage shield and the low voltage shield are disposed on an opposite side of the printed circuit board as the high voltage doubler circuit.

6. The high voltage power supply of claim 1, further comprising an intermediate shield disposed between two adjacent low voltage doubler circuits.

7. The high voltage power supply of claim 6, wherein the intermediate shield is disposed at a midpoint of the high voltage doubler circuit.

8. The high voltage power supply of claim 6, further comprising a second intermediate shield disposed between a different two adjacent low voltage doubler circuits.

9. The high voltage power supply of claim 1, wherein a voltage across a first low voltage doubler circuit disposed closest to the first end is within 10% of a voltage across a last low voltage doubler circuit disposed closest to the second end.

\* \* \* \* \*